(12) United States Patent
Shi et al.

(10) Patent No.: US 6,320,427 B1
(45) Date of Patent: Nov. 20, 2001

(54) HIGH-SPEED, LOW-POWER CONTINUOUS-TIME CMOS CURRENT COMPARATOR

(75) Inventors: Bingxue Shi; Lu Chen, both of Beijing (CN)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 09/689,567

(22) Filed: Oct. 11, 2000

(51) Int. Cl.[7] ....................................................... H03K 5/22
(52) U.S. Cl. ........................... 327/77; 327/80; 327/109; 326/82; 326/83
(58) Field of Search ........................ 327/77, 80, 108, 327/109, 112; 326/82, 83, 84, 85, 86, 87, 91; 330/262, 264, 265

(56) References Cited

U.S. PATENT DOCUMENTS

| | | | |
|---|---|---|---|
| Re. 31,749 | * 11/1984 | Yamashiro | 330/264 |
| 4,071,830 | * 1/1978 | Huntington | 330/277 |
| 4,309,665 | * 1/1982 | Yamashiro | 330/264 |
| 5,041,744 | * 8/1991 | Sakai et al. | 327/77 |
| 5,329,190 | * 7/1994 | Igarashi et al. | 327/309 |

* cited by examiner

Primary Examiner—Timothy P. Callahan
Assistant Examiner—An T. Luu
(74) Attorney, Agent, or Firm—Ladas & Parry

(57) ABSTRACT

A CMOS current comparator featuring shortened response delay times lower power consumption, smaller area and enhanced process robustness. The current comparator is comprised of a CMOS complementary amplifier, two resistive-load amplifiers and two CMOS inverters. The CMOS complementary amplifier receives an input current from an input node which generates an output voltage at a corresponding output node. The CMOS complementary amplifier is comprised of an N-type metal oxide semiconductor field effect transistor (NMOS) and a P-type metal oxide semiconductor field effect transistor (PMOS) connected in series. Control gates on both the NMOS and PMOS are connected to form the input node. NMOS and PMOS drain electrodes are also coupled to the output node. The CMOS complementary amplifier further has a resistive feedback circuit which is connected between the input and output nodes. The two resistive-load amplifiers are connected in cascade form to receive and amplify output voltage from the CMOS complementary amplifier. The result being a correspondingly output of amplified voltage. The two CMOS inverters are also connected in cascade form to receive the amplified voltage and output corresponding rail-to-rail result signal.

20 Claims, 4 Drawing Sheets

HIGH-SPEED, LOW-POWER CONTINUOUS-TIME CMOS CURRENT COMPARATOR

BACKGROUND OF THE INVENTION

1. Field of the Invention

The present invention generally relates to a complementary metal-oxide-semiconductor (CMOS) current comparator. More specifically, the present invention relates to a CMOS current comparator featuring shortened response delay time, low power consumption, smaller area and enhanced process robustness.

2. Description of the Related Art

In recent years current-mode signal manufacturing processes using CMOS technology has gained great interest. Using this approach, many analog CMOS circuits have been designed with the objectives of smaller area, higher speed and lower supply voltage. Moreover, it is compatible with digital process thereby allowing current-mode circuit technology to be considered an viable alternative to voltage-mode circuit technology in high speed, low-power applications. As a fundamental component of current-mode analog systems, a current comparator can be used, for example, in analog-to-digital (A/D) converters, oscillators, current to frequency converters and Very-Large-Scale-Integrated (VLSI) circuit neural networks.

For high-speed applications, a number of high-performance continuous-time CMOS current comparators have been purposed in the past few years. FIG. 1 represents a current comparator proposed in Electronics Letters, Vol.28, No.3, pp.310–312, 1992 by Traff. The current comparator proposed by Traff uses a source-follower (M1 and M2) as an input stage and a CMOS inverter as a positive feedback thereby enabling lower input resistance and shorter response time when compared with the original current comparator based on current mirrors. However, in pursuit of dynamic response from smaller input current levels, there temporarily exists a deadband region in which the two input transistors (M1 and M2) are both turned off to induce higher input resistance. Hence, achievement of a decrease in input current without this side-effect would dramatically increase the dynamic response of the current comparator provided by Traff.

FIG. 2 depicts a current comparator designed to solve this problem as proposed by Tang in Electronics Letters, Vol.30, No.1, pp.5–6, 1994. Here, Tang changes the biasing scheme of the input stage from class B operation to class AB operation by adding two triode-operation transistors (M3 and M4). The intent being reduction of the deadband region and decreased response time for small input current. However, this circuit structure is overly complicated. Four additional current sources ($I_1$—$I_4$) are needed for constructing the biasing circuit to enable enhanced power dissipation. Moreover, the process deviations have substantial negative effects on the current comparator as its performance is closely related to the value of the four current sources. Furthermore, the bulks of two bias transistor, M3 and M4, are connected to their sources, rather than to ground and power, respectively. Hence, a complicated twin-tub CMOS manufacturing process is needed to implement Tang's circuit design.

FIG. 3 represents the current comparator proposed by Min as published in Electronics Letters, Vol.34, No.22, pp.2074–2076, 1998. In FIG. 3, the current comparator comprises three current-source inverting amplifiers and a CMOS inverter. A resistive feedback network is added to the first current-source inverting amplifier in an effort to decrease input resistance. Although this circuit exhibits low response time and good process immunity, its resolution is limited by the bias current as high-resolution applications require large bias current and consume substantially more power. Moreover, because current-source amplifiers are utilized, power consumption does not decrease as input current increases.

SUMMARY OF THE INVENTION

Therefore, an objective of the present invention is to provide a new continuous-time current comparator design solution featuring shortened response delay time, lower power consumption, smaller area and enhanced process robustness.

The present invention achieves the above-indicated objectives by providing a current comparator comprising a CMOS complementary amplifier, two resistive-load amplifiers and two CMOS inverters. The CMOS complementary amplifier receives an input current from an input node which generates an output voltage at a corresponding output node. The CMOS complementary amplifier is comprised of an N-type metal oxide semiconductor field effect transistor (NMOS) and a P-type metal oxide semiconductor field effect transistor (PMOS) connected in series. Control gates on both the NMOS and PMOS are connected to form the input node. NMOS and PMOS drain electrodes are also coupled to the output node. The CMOS complementary amplifier further has a resistive feedback circuit which is connected between the input and output nodes. The two resistive-load amplifiers are connected in cascade form to receive and amplify output voltage from the CMOS complementary amplifier. The result being a correspondingly output of amplified voltage. The two CMOS inverters are also connected in cascade form to receive the amplified voltage and correspondingly output rail-to-rail result signal.

Lastly, simulation results show the current comparator, according to the present invention, provides a better speed/power ratio when compared to current comparators of the existing art.

BRIEF DESCRIPTION OF THE DRAWING

The following detailed description(s) will best be understood in conjunction with the accompanying drawings, in which.

DETAILED DESCRIPTION OF THE PREFERRED EMBODIMENTS

Figure 1:
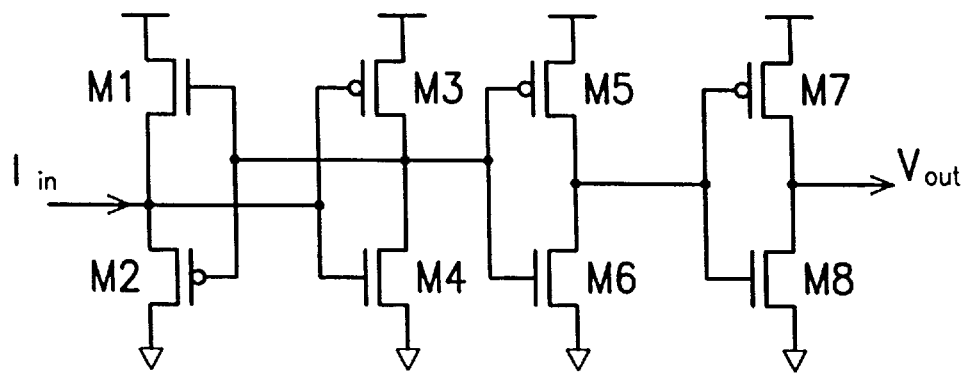
FIG. 1 represents the current comparator proposed by Traff.
Figure 2:
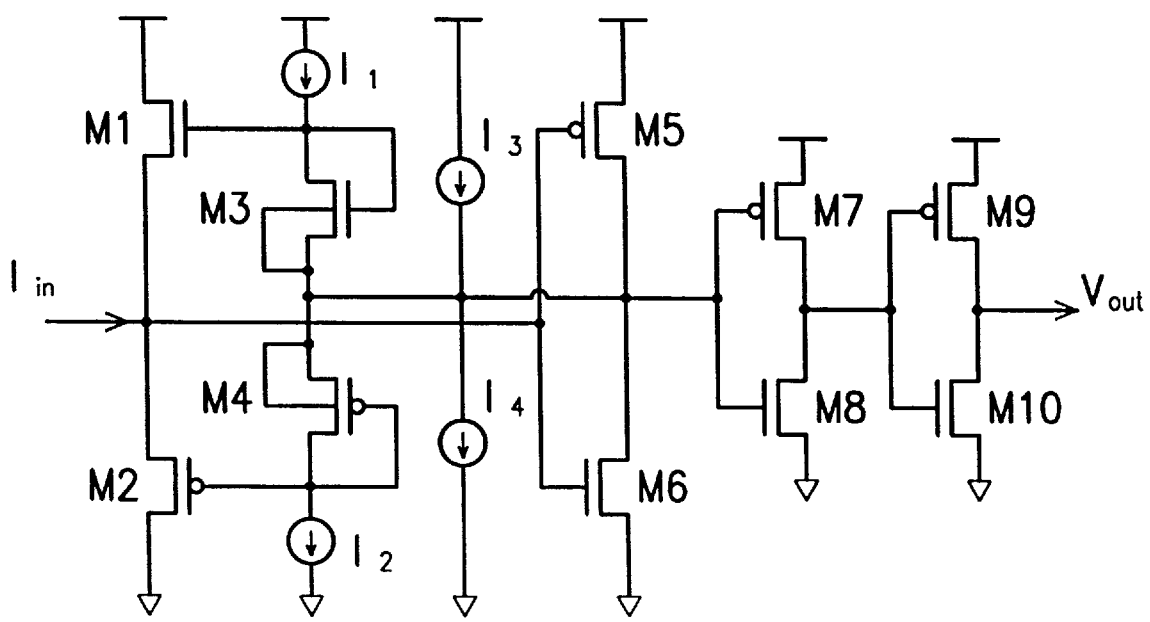
FIG. 2 represents the current comparator proposed by Tang.
Figure 3:
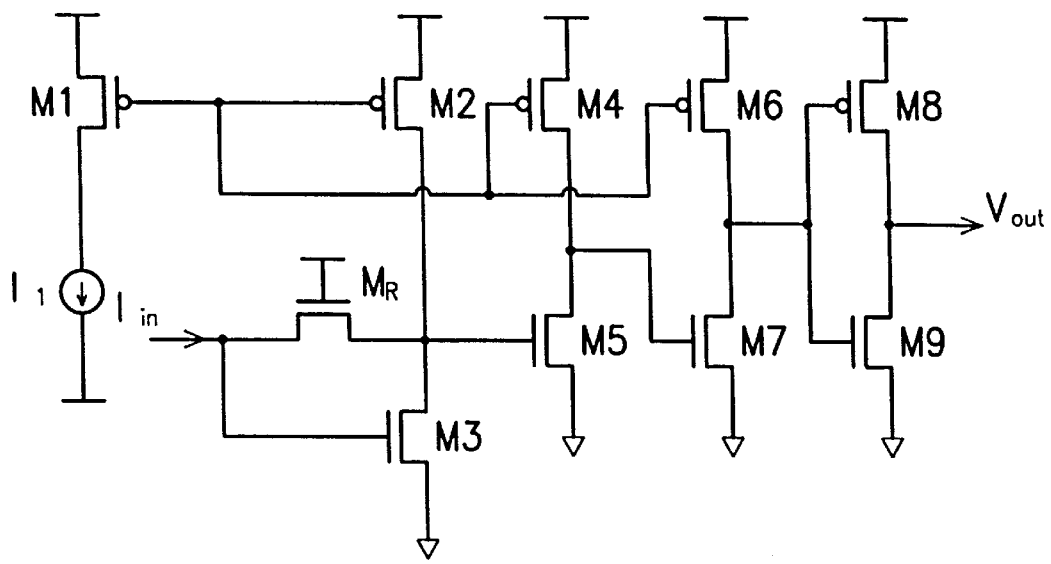
FIG. 3 represents the current comparator proposed by Min.
Figure 4:
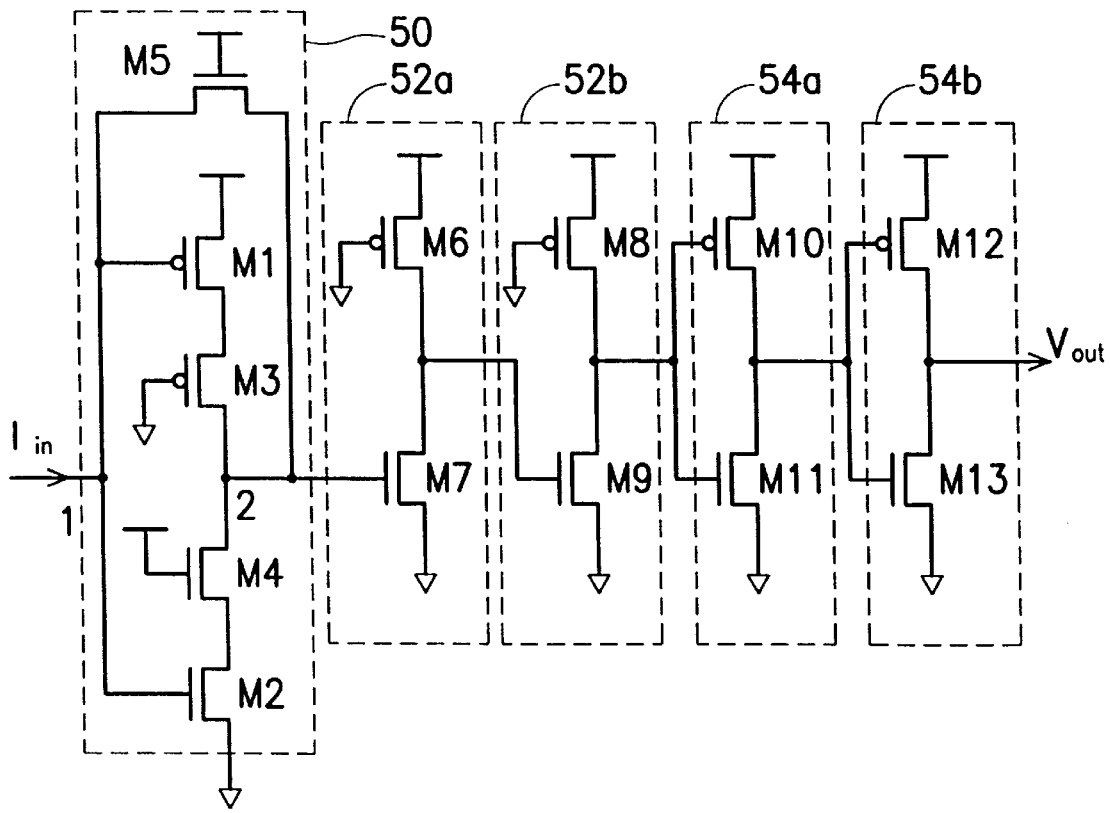
FIG. 4 represents the current comparator according to the presetn invention.

The new continuous-time CMOS current comparator according to the present invention is shown in FIG. 4. It comprises one CMOS complementary amplifier 50, two resistive-load amplifiers (52a and 52b) and two CMOS inverters (54a and 54b).

To implement a CMOS complementary amplifier, M1 and M2 are connected in series. The gates of M1 and M2 are connected together to form node 1. M1 and M2 have drains coupled together to node 2. Because Ml and M2 both work in a saturate region, M3 and M4 are serially connected to M1 and M3 respectively, thereby decreasing working current. M5, working in an ohmic region, acts as the negative feedback resistor of the CMOS complementary amplifier 50.

The CMOS complementary amplifier receives an input current from node 1 and generates a corresponding output voltage at node 2. According to small-signal analysis, when M3 and M4 are neglected, the input and output resistances ($R_{in}$ and $R_{out}$) of the CMOS complementary amplifier 50 with a feedback resistor can be expressed as:

$$R_{in} = \frac{R_5 + R_p}{1 + (g_{m1} + g_{m2})R_p}$$

$$R_{out} = \frac{R_5 + R_c}{1 + (g_{m1} + g_{m2})R_c + (R_5 + R_c)/R_p}$$

Where $R_p = (r_{ds1} \| r_{ds2})$, $g_{m1}$ and $g_{m2}$ are the transconductances of M1 and M2 respectively, $R_5$ is the on-resistance of M5, and $R_c$ is the input resistance of the next stage, the resistive-load amplifier 52a. Because generally $R_5 \ll R_p$, $R_5 \ll R_c$ and $(g_{m1}+g_{m2})*R_p \gg 1$, one can conclude both $R_{in} \sim 1/(g_{m1}+g_{m2})$ and $R_{out} \sim 1/(g_{m1}+g_{m2})$. Such small input and output resistances can reduce voltage swings at node 1 and 2 thereby decreasing the response time of the current comparator.

To amplify the small voltage swing at node 2, two resistive-load amplifiers are used to provide additional gain and decrease the power consumption of large input current as compared with the current-load amplifiers found in Min's comparator. The last two CMOS inverters can output a rail-to-rail compared result signal, while the introduced delay time is negligible in practice. The current comparator according to the present invention also has no external bias currents nor bias voltages and so, the process deviation immunity is enhanced.

In FIG. 4, M3, M4, M5, M6 and M8 are transistors to act as resistors. Thus, they can be replaced by any kind of resistor. Replacement candidates, for example, could include polysilicon resistors, n-well resistors, p-well resistors, MOS's operating in an ohmic region, etc.

Furthermore, the primary function(s) of M3 and M4 is/are to reduce the working current of the CMOS complementary amplifier. M3 and M4 can then be inserted into the current path constructed by power, M1, M2 and ground to achieve that purpose. Therefore, M3 is connected between node 2 and the drain of M1 (as shown in FIG. 4) and M3 can be changed to connect between power and the source of M1. The same concept is true for M4 relative to M2.

To compare the performance of the current comparator according to the present invention with those of Traff, Tang, and Min, High-optimixed Simulation Program with Integrated Circuit Emphasis (HSPICE) simulations of four current comparators are performed using standard 1.2μm CMOS technology parameters with 3V power supply. The proposed transistor dimensions of the current comparator for the present invention are shown in Table 1 as below.

TABLE 1

| Device | M1 | M2 | M3 | M4 | M5 | M6 | M7 |
|---|---|---|---|---|---|---|---|
| W (μm) | 7.5 | 2.4 | 4 | 4 | 2 | 4 | 4 |
| L (μm) | 1.2 | 1.2 | 2 | 8 | 8 | 4 | 2 |
| Device | M8 | M9 | M10 | M11 | M12 | M13 | |
| W (μm) | 4 | 4 | 11.5 | 4 | 8.4 | 3 | |
| L (μm) | 4 | 2 | 2 | 2 | 1.6 | 1.6 | |

Figure 5:
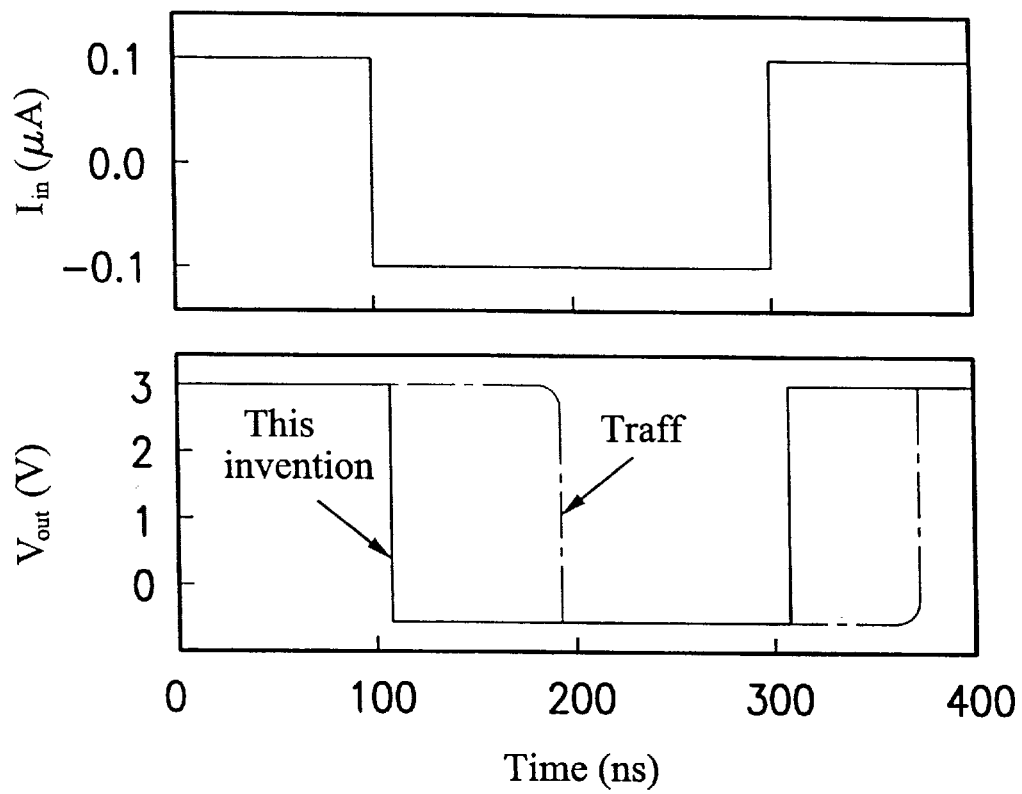
FIG. 5 illustrates trasient output voltage against input square-wave current for Traff's current comparator and the current comparator of the present invention.

The transient response of the four comparators are simulated for input square-wave currents with amplitudes ranged from ±0.01μA to ±10μA. FIG. 5 shows the transient waveform of the output voltages for the current comparator of the present invention and that of Traff's when the input square-wave current changes between 0.1μA and −0.1μA. According to FIG. 5, the delay time of the proposed current comparator is about 8ns which is ten times lower than that of Traff's.

Figure 6:
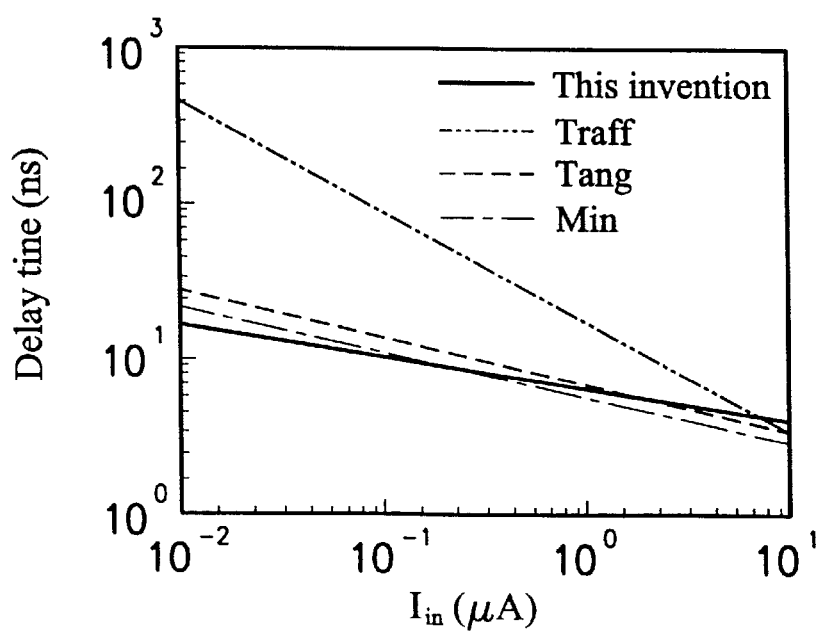
FIG. 6 illustrates average delay times versus input current.

FIG. 6 shows the average delay times of the four comparators as a function of amplitude of the input square-wave current. Using a low input current, the delay time of the current comparator according to the present invention is much lower than that of Traff's and is comparable with those of Tang's and Min's. When input current is increased, note that the four delay times are almost identical. This is because under such a condition, the delay time is determined primarily by the propagation delay of the inverting amplifier stages as opposed to the time when sufficient feedback is applied.

Although there is no apparent predominance of the delay time for the current comparator according to the present invention over those of Tang's and Min's current comparators, power consumption for the current comparator of the present invention is indeed lower.

Figure 7:
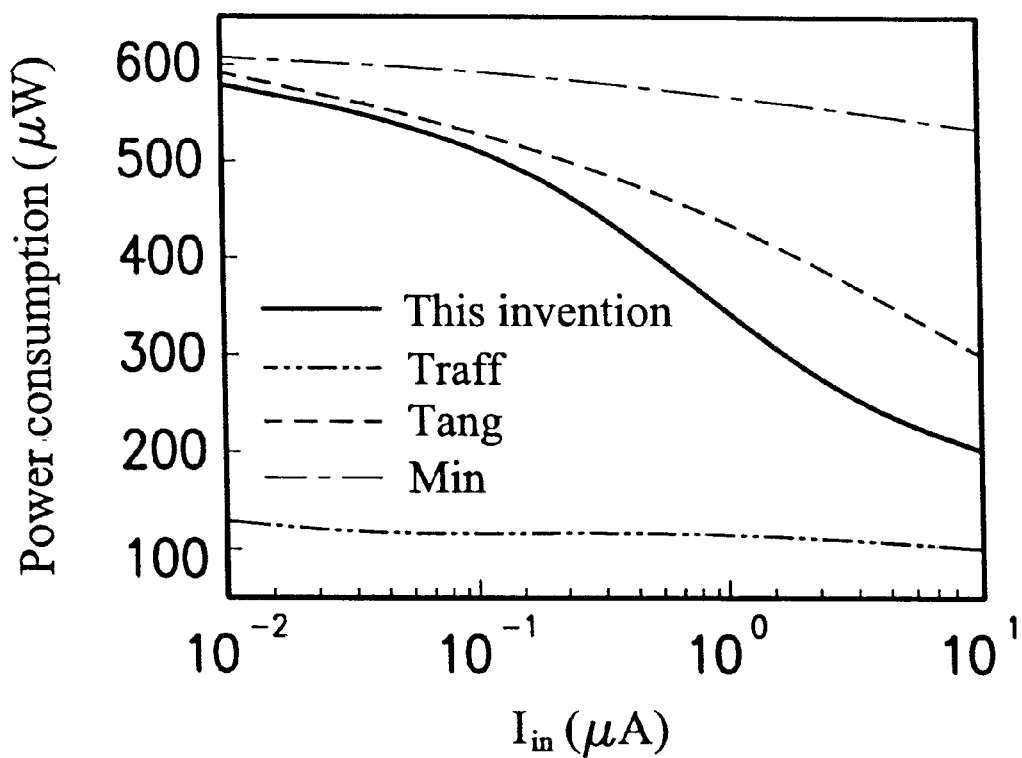
FIG. 7 illustrates and compares power consumption versus input current of the four current comparator designs discussed above.

FIG. 7 shows the power consumption of the four comparators as a function of the amplitude of the input square-wave current. Although the power consumption of Traff's is the lowest, it is achieved at the expense of a large delay time for small input current which is attributable to its larger voltage swing. In comparing the current comparator according to the present invention with those of Tang and Min, note that when the input current is 0.01μA, the values of their power consumption are almost the same. However, when input current is increased, the values of the power consumption of the current comparator according to the present invention and that of Tang's decrease rapidly while that of Min's maintains almost the same. This is because Min's current comparator uses current-source amplifiers and its bias current doesn't change when the input current changes. Now note that when input current is 1μA, the values of the power consumption of the current comparator according to the present invention and those of Tang's and Min's are 0.3 mW, 0.37 mW and 0.53 mW respectively while their delay times are almost the same. Thus, the speed/power ration of the current comparator according the present invention, over those of Tang's and Min's, is approximately 127% and 177% respectively.

Further, the current comparator according to the present invention uses only 13 transistors to achieve these greater speed/power performance levels. In contrary, Tang's comparator uses 10 transistors and 4 current sources while Min's use 10 transistors and 1 current source with the one current source requiring several transistors for implementation. Therefore, the silicon area of the current comparator according to the present invention will be smaller than those of Tang's and Min's. Additionally, the 13 transistors in the current comparator of the present invention have bulks connected only to power or ground. Therefore, they can be fabricated using conventional CMOS processes.

Finally, while the invention has been described by way of example and in terms of the preferred embodiment(s), it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A current comparator, comprising:
   a CMOS complementary amplifier to receive an input current from an input node and generate correspondingly output voltage at an output node, comprising:
      a NMOS and a PMOS connected in series, the NMOS and the PMOS having control gates that connect to form the input node, the NMOS and the PMOS having drain electrodes coupled to the output node; and
      a resistive feedback circuit connected between the input node and the output node; and
   a secondary amplifier to receive the output voltage at the output node and output a corresponding rail-to-rail result signal.

2. The current comparator as claimed in claim 1, wherein the CMOS complementary amplifier further has a first current-suppressing resistor connected in series to the NMOS, and a second current-suppressing resistor connected in series to the PMOS.

3. The current comparator as claimed in claim 2, wherein the first current-suppressing resistor is implemented with a MOS transistor or a polysilicon-resistor.

4. The current comparator as claimed in claim 2, wherein the second current-suppressing resistor is implemented with a MOS transistor or a polysilicon-resistor.

5. The current comparator as claimed in claim 1, wherein the resistive feedback circuit is a resistor connected between the input node and the output node.

6. The current comparator as claimed in claim 5, wherein the resistor is implemented with a MOS transistor or a polysilicon-resistor.

7. The current comparator as claimed in claim 1, wherein the secondary amplifier comprises:
   a small-signal amplifier to receive and amplify the output voltage from the CMOS complementary amplifier and output an amplified voltage; and
   a full-ranged amplifier to receive the amplified voltage and output the rail-to-rail result signal.

8. The current comparator as claimed in claim 7, wherein the small-signal amplifier comprises two resistive-load amplifiers connected in cascade form.

9. The current comparator as claimed in claim 8, wherein each of the resistive-load amplifiers has a MOS transistor and a load resistor connected in series.

10. The current comparator as claimed in claim 7, wherein the full-ranged amplifier comprises two CMOS inverters connected in cascade form.

11. The current comparator as claimed in claim 1, wherein the resistive feedback circuit is used to decrease the input and output resistances of the CMOS complimentary amplifier, so that speed of the current comparator can be increased.

12. The current comparator as claimed in claim 1, wherein the current comparator is a continuous-time current comparator and the input current is continuous.

13. The current comparator as claimed in claim 2, wherein the two current-suppressing resistors are used to reduce the working current through the NMOS and the PMOS; and when the input current is zero, size of the two current-suppressing resistors can be adjusted to control the output voltage.

14. The current comparator as claimed in claim 8, wherein the resistive-load amplifiers are used to provide additional gain for the current comparator in that when the magnitude of the input current increases, power consumption of the current comparator will not be limited by bias current.

15. A current comparator, comprising:
   a CMOS complementary amplifier to receive an input current from an input node and generate corresponding output voltage at an output node, comprising:
      a NMOS and a PMOS connected in series, the NMOS and the PMOS having control gates that connect to form the input node, the NMOS and the PMOS having drain electrodes coupled to the output node; and
      a resistive feedback circuit connected between the input node and the output node;
   two resistive-load amplifiers connected in cascade form to receive and amplify the output voltage from the CMOS complementary amplifier and output corresponding amplified voltage; and
   two CMOS inverters connected in cascades form to receive the amplified voltage and output a corresponding rail-to-rail result signal.

16. The current comparator as claimed in claim 15, wherein the CMOS complementary amplifier further has a first current-suppressing resistor connected in series to the NMOS, and a second current-suppressing resistor connected in series to the PMOS.

17. The current comparator as claimed in claim 16, wherein the first current-suppressing resistor is implemented with a MOS transistor or a polysilicon-resistor.

18. The current comparator as claimed in claim 16, wherein the second current-suppressing resistor is implemented with a MOS transistor or a polysilicon-resistor.

19. The current comparator as claimed in claim 15, wherein the resistive feedback circuit is a resistor connected between the input node and the output node.

20. The current comparator as claimed in claim 19, wherein the resistor is implemented with a MOS transistor or a polysilicon-resistor.

* * * * *